United States Patent
Tomaru et al.

(10) Patent No.: US 6,563,195 B1
(45) Date of Patent: May 13, 2003

(54) WAFER SUPPORT HAVING A DUSTPROOF COVERING FILM

(75) Inventors: Kazuhiko Tomaru, Gunma-Ken (JP); Tsutomu Yoneyama, Gunma-Ken (JP); Ryuichi Handa, Gunma-ken (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 15 days.

(21) Appl. No.: 09/672,054

(22) Filed: Sep. 29, 2000

(30) Foreign Application Priority Data

Sep. 29, 1999 (JP) ............................. 11-276216

(51) Int. Cl.⁷ .................. G02F 1/1333; B05D 5/10; B32B 31/06; B32B 7/06
(52) U.S. Cl. .................. 257/620; 257/618; 257/795; 349/122; 349/158; 349/117; 349/112; 428/41.9; 428/12.4; 428/354; 428/349; 428/458; 428/461
(58) Field of Search .................. 257/620, 700, 257/701, 758, 702, 775, 789, 787, 795, 618; 349/122, 158, 98, 117, 112; 428/41.9, 12.4, 354, 349, 421.2, 458, 461, 516

(56) References Cited

U.S. PATENT DOCUMENTS

| 4,393,130 A | * | 7/1983 | Ho et al. ................ 430/313 |
| 4,447,579 A | * | 5/1984 | Takagi et al. ............. 525/113 |
| 4,828,920 A | * | 5/1989 | Nakabayashi et al. ....... 428/349 |
| 4,897,171 A | * | 1/1990 | Ohmi ..................... 204/298 |
| 5,183,699 A | * | 2/1993 | Takemura et al. .......... 428/214 |
| 5,364,669 A | * | 11/1994 | Sumida et al. .............. 428/1 |
| 5,849,460 A | * | 12/1998 | Kawai et al. ............ 430/280.1 |
| 6,071,630 A | * | 6/2000 | Tomaru et al. ............ 428/627 |
| 6,106,952 A | * | 8/2000 | Yamashita et al. ........ 428/425.8 |
| 6,185,086 B1 | * | 2/2001 | Tanaka et al. ............ 361/308.1 |
| 6,208,397 B1 | * | 3/2001 | Shimodaira et al. ......... 349/122 |
| 6,218,017 B1 | * | 4/2001 | Yamashita et al. ........ 428/424.2 |
| 6,235,366 B1 | * | 5/2001 | Matsumoto et al. ........ 428/41.9 |
| 6,258,196 B1 | * | 7/2001 | Suzuki et al. ............. 156/176 |
| 6,263,941 B1 | * | 7/2001 | Bryan et al. .............. 438/455 |

* cited by examiner

Primary Examiner—Alexander O. Williams
(74) Attorney, Agent, or Firm—Millen, White, Zelano & Branigan, P.C.

(57) ABSTRACT

A dustproof covering film-attached wafer support comprising a base, a silicone rubber layer substantially uniform in thickness and integrated with the base and a dustproof covering film, with the dustproof covering film is attached to the silicone rubber layer in a state that the peel strength between the dustproof covering film and the silicone rubber layer is from 5 to 500 g/25 mm, thereby enabling the covering film to be peeled apart as the need arises; and a production method for such a wafer support.

20 Claims, 4 Drawing Sheets

A-B cross section

WAFER SUPPORT HAVING A DUSTPROOF COVERING FILM

FIELD OF THE INVENTION

The present invention relates to a wafer support used for fixing a semiconductor wafer in a processing room of device production apparatus, a method for producing such a wafer support and a method of using such a wafer support.

BACKGROUND OF THE INVENTION

With the recent remarkable popularization of personal computers, game machines and cellular phones as consumer products, demands for cost reduction in semiconductor device production have been growing. For achieving the cost reduction, improvement in production yield of semiconductor devices is required.

One of factors responsible for a drop in production yield of semiconductor devices consists in a problem that particles adhere to the front or/and rear surfaces of wafer in the production process. As these particles cause breaks in circuits and insulation faults in electrical insulating films, the reduction thereof is strongly desired.

Although wafer supports are used for fixing wafers in a device production apparatus, such as an exposure apparatus, an ion injection apparatus, an etching apparatus, a CVD apparatus, a sputter apparatus or a burn-in apparatus, it is required of the supports to have many other important abilities, including an ability to ensure accurate registration of wafers, an ability to correct the warpage of wafers and an ability to maintain the wafer temperature uniform. Examples of a wafer support which has so far been proposed and used in practice include a ceramic support equipped with a clamping mechanism, a metallic support equipped with a clamping mechanism, a support comprising a base made of ceramic and/or metal, a silicone rubber laminated on 5 the base surface and a clamping mechanism, and an electrostatic chuck (See, e.g., U.S. Pat. No. 4,832,781 and Japanese Tokkai Sho 63-193450). In particular, the support having a silicone rubber laminated ceramic or metallic base is widely used because of its relatively low price and excellent temperature maintaining capability.

However, the support having silicone rubber laminated on the surface of a base made of ceramic and/or metal has a problem that, in the conventional case where the support is made in a clean room, washed with purified water and packed directly in a plastic film bag, slippages occur between the film surface and the silicone rubber surface during transport to form particles from both silicone rubber and plastic film by friction between them. Further, such a wafer support has another problem that, when the wafer support is installed in the device production apparatus as recited above, the operator is required to prevent pollution of the silicone rubber surface of the wafer support by impurities in the air and perform the installation work without touching the silicone rubber surface; as a result, the workability is markedly lowered.

SUMMARY OF THE INVENTION

As a result of our intensive studies for resolving the aforementioned problems, it has been found that the formation of particles during transport and the pollution caused during the installation work can be prevented by providing a special dustproof covering film on the silicon rubber surface of a wafer support of the type which has the silicone rubber layer on a base made of ceramic and/or metal and peeling the dustproof covering film apart from the silicone rubber layer immediately before use, and a method for producing a pollution-free wafer support at a low price has been developed, thereby achieving the present invention.

More specifically, a first subject matter of the present invention is a dustproof covering film-attached wafer support comprising a base, a silicone rubber layer substantially uniform in thickness and integrated with the base and a dustproof covering film, wherein the covering film is attached to the silicone rubber layer in a state that the covering film is capable of being peeled apart from the silicone rubber layer and the peel strength between the covering film and the silicone rubber layer is from 5 to 500 g/25 mm, measured by the peeling test according to JIS K 6854.

A second subject matter of the invention is a method for producing a dustproof covering film-attached wafer support, comprising the following steps (A) to (D):

(A) a step of forming a silicone rubber layer substantially uniform in thickness on a process sheet having a surface roughness (Ra) of 0.1 to 5.0 μm which functions as a dustproof covering film, (B) a step of forming the silicone rubber layer into a desired shape and boring guide holes for registration in the process sheet, (C) a step of applying an adhesive to one surface of a base, and (D) a step of sticking the silicone rubber layer formed on the process sheet to the adhesive-applied base surface, wherein the guide holes bored in the process sheet are used for properly positioning the silicone rubber layer on the base.

A third subject matter of the invention is a method of using a dustproof covering film-attached wafer support as described in the first subject matter, comprising a step of peeling the dustproof covering film apart from the silicone rubber layer in the processing room of a device production apparatus selected from a group consisting of an exposure apparatus, an ion injector, an etching apparatus, a CVD apparatus, a sputtering apparatus and a burn-in apparatus, and a step of fixing a semiconductor wafer onto the silicone rubber layer of the wafer support.

Figure 1:
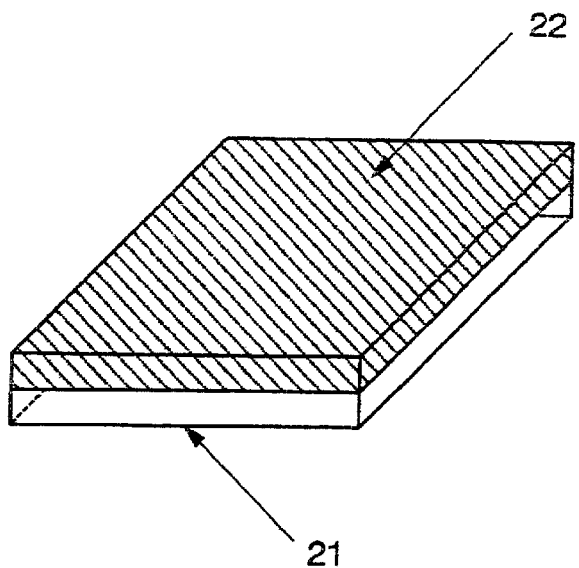
FIG. 1 is an oblique view of a process sheet integrated with a silicone rubber layer into a single piece.

The reference numerals in those figures designate the following members:

1 Wafer support

2 Base 3, 22, 31 Silicone rubber layer
4, 21 Process sheet (dustproof covering film)
41 Edge for cutting a silicone rubber layer
42 Edge for boring guide holes
43, 44 Stamping die
51, 53 Die
54 Adhesive

DETAILED DESCRIPTION OF THE INVENTION

The present method for producing a dustproof covering film-attached wafer support is illustrated below in detail.

At the step (A), a silicone rubber layer 22 is formed on a process sheet 21 first, and then they are integrated into a single piece (FIG. 1). Herein, it is desirable that the silicone rubber layer 22 be uniform in a substantial sense. The process sheet 21 functions as a dustproof covering film on the final wafer support.

If the silicone rubber layer formed on the surface of a process sheet (covering film) easily peels off the process sheet, undesirable particles are formed by friction between the rubber and the covering film. Therefore, it is advantageous to ensure a peel strength of 5 to 500 g/25 mm (about 0.05 to about 5 N/25 mm), preferably 10 to 100 g/25 mm (about 0.1 to about 1 N/25 mm), between the covering film and the silicone rubber layer. In the invention, the peel strength is determined by the T-type peeling test according to JIS K 6854. The peel strength within the foregoing range can be achieved by controlling the surface roughness (Ra) of a covering film (process sheet) to a range of 0.1 to 5.0 $\mu$m, preferably 0.3 to 2.0 $\mu$m. The measurements of surface roughness (Ra) in the invention are made in accordance with the method defined in JIS B 0601. By adjusting the surface roughness of the process sheet to the foregoing range, it becomes difficult for the silicone rubber layer to peel off the process sheet during the production, the transport and the installation working; as a result, the formation of particles by friction can be prevented. When Ra is smaller than 0.1 $\mu$m, the silicone rubber tends to fall out or undergo displacement during the production working and the dustproof covering film tends to peel off and slide during the transport and the installation working, and thereby particles are formed. Even when Ra is increased beyond 5 $\mu$m, further improvement of accuracy in positioning a silicone rubber layer cannot be expected, and besides, it is apt to become difficult to peel apart the covering film.

As the process sheet 21, any films can be employed so far as they satisfy the foregoing requirement. From the viewpoints of the uniformity in film thickness, the heat resistance and the price, it is advantageous to use a polyethylene terephthalate (PET) film, a nylon film, a polyimide (PI) film or a polytetrafluoroethylene (PTFE) film. The suitable thickness of such a film is from 25 to 1,000 $\mu$m, preferably from 50 to 300 $\mu$m, from viewpoints of the working ease and the strength. When the film used is too thin, it lacks the stiffness required for a process sheet, and so it is difficult to handle and inferior in workability. When the film used is too thick, on the other hand, it is hard to make registration guide holes therein at the step (B).

In order that the wafer support meets the performance requirements mentioned above, the thickness of the silicone rubber layer 22 is required to be uniform in a substantial sense. The accuracy of layer thickness (thickness tolerance) is desirably ±0.05 mm or below, especially ±0.03 mm or below. The silicone rubber usable for the present silicone rubber layer may have any properties before curing. Specifically, any of conventional silicone rubbers, including both millable-type silicone rubbers and liquid silicone rubbers, may be employed. As to the curing mode of silicone rubber, the silicone rubber used in the invention may be any of silicone rubbers curable by peroxides, those curable by addition reaction, those curable by UV and those curable by electron beams. When millable-type silicone rubber is used, it is appropriate to adopt a calender or extrusion method for forming the silicone rubber layer on a process sheet because these methods can confer a uniform thickness on the layer formed. Further, the method as described above may be used in combination with a press method, if desired, because the combined use has an advantage in that it can raise the thickness accuracy of the layer formed.

When liquid silicone rubber is used for forming the silicone rubber layer, on the other hand, it is advantageous to adopt a coating method or a spray method. For raising the thickness accuracy, the press method may be used in combination, if needed.

The suitable thickness of silicone rubber layer, irrespective of the type of silicone rubber used, is from 10 to 2,000 $\mu$m, preferably from 50 to 500 $\mu$m. When the silicone rubber layer is too thin, it cannot absorb the warpage of wafer to fail in ensuring a good contact with the wafer; as a result, it becomes difficult to maintain the wafer temperature uniform. When the silicone rubber layer is too thick, on the other hand, it has high heat resistance as well as little possibility of enhancing its warpage absorbing capability to bring about a rise in cost.

At the step (B), the silicone rubber layer is formed into a desired shape, and guide holes for registration are made in the process sheet.

Figure 2:
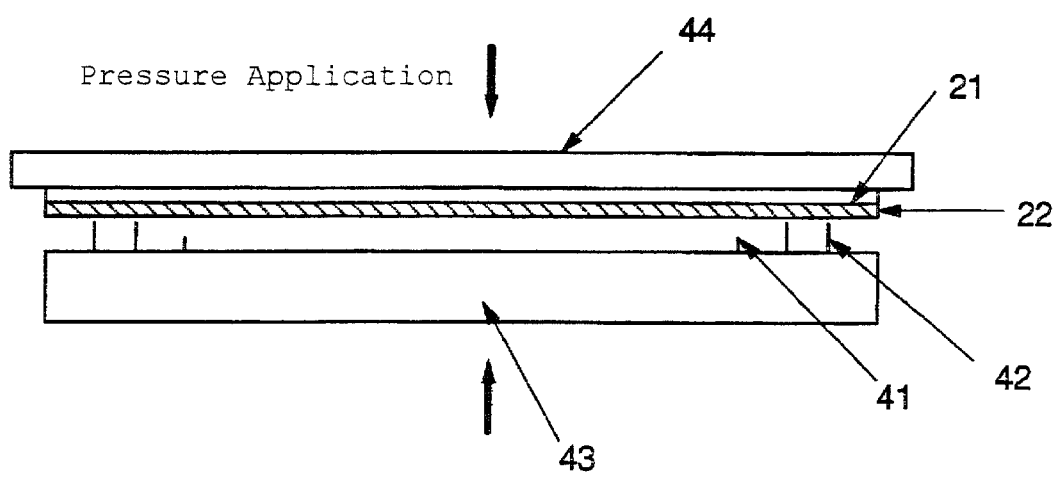
FIG. 2 is a cross section of a jig for perforation.

FIG. 2 shows an example of a jig for stamping and an example of a stamping method, which are usable at the step (B).

The stamping die 43 is provided with an edge 41 for cutting silicone rubber and an edge 42 for boring registration guide holes in the process sheet, and the difference in height between the edge 41 and the edge 42 is set so as to be greater than the thickness of the silicone rubber layer. By doing so, the silicone rubber layer can be stamped into a desired shape, and besides, the guide holes 32 used for registration can be bored in the process sheet with efficiency. After the conclusion of this step, the unnecessary part of the silicone rubber layer may be removed.

The guide holes bored in the process sheet 33 are used for properly positioning the silicone rubber layer 31 on the base 2 in the step (D) described hereinafter wherein the silicone rubber layer provided on the process sheet is stuck to the base with an adhesive. Therefore, the shape, size and number of the guide holes 32 can be chosen properly so as to serve the registration purpose.

At the step (B), though it is not always necessary to cut the process sheet except that the guide holes are cut out, the process sheet may be cut off into an appropriate-sized piece so far as the piece size is large enough to cover the silicone rubber sheet and the guide holes.

Figure 3:
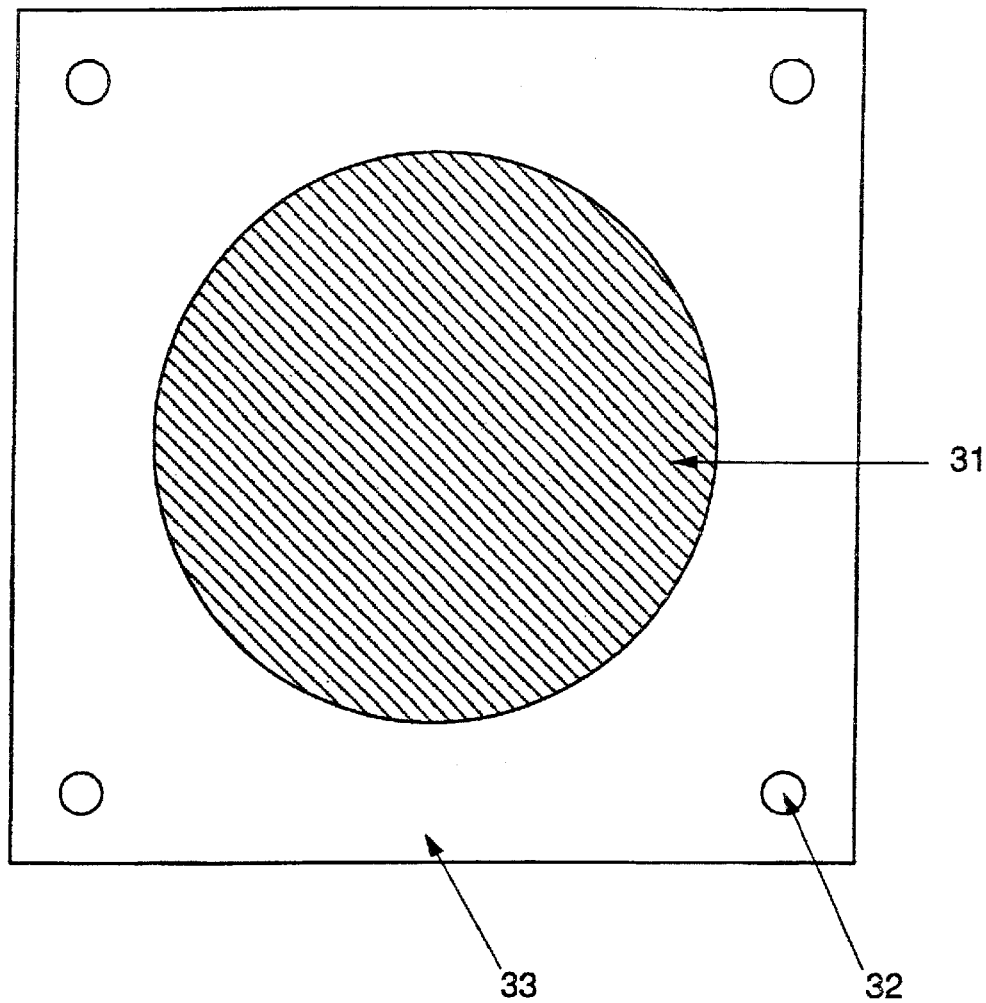
FIG. 3 shows plan and cross sectional views of a silicone rubber layer-integrated process sheet from which an unnecessary part of the silicone rubber layer is peeled away.
Figure 3:
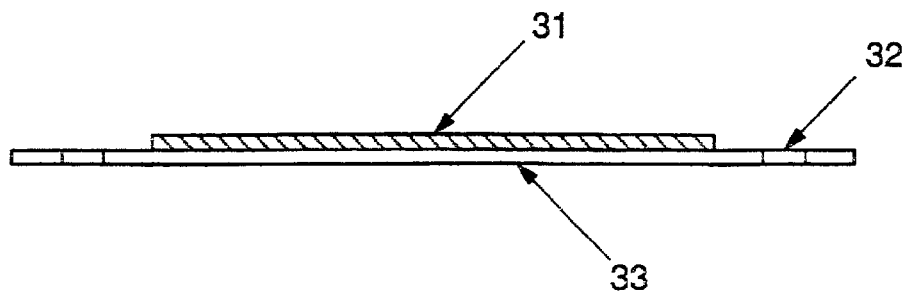

The silicone rubber layer-attached process sheet prepared at the step (B) is shown in FIG. 3.

At the step (C), an adhesive 54 is applied to the surface of a base 2. The base 2 is used for fixing a semiconductor wafer, and it may be made of any materials so far as they can ensure the foregoing required performance. Preferably, the base is made of ceramic, metal or the combination thereof.

Examples of an adhesive which can be used therein include liquid silicone rubber adhesives containing as an adhesive component at least one compound selected from among carbon-functional silanes, hydrolytic organotitanium compounds or mixtures thereof, dilute solutions of organic solvents in which is dissolved at least one compound selected from among carbon-functional silanes, hydrolytic organotitanium compounds or mixtures thereof (referred to as primers also), and combinations of two or more of the adhesives recited above.

Such an adhesive can be suitably applied using a coating method or a spray method. In particular, it is advantageous for the adhesive to be applied using a screen printing method.

Figure 4:
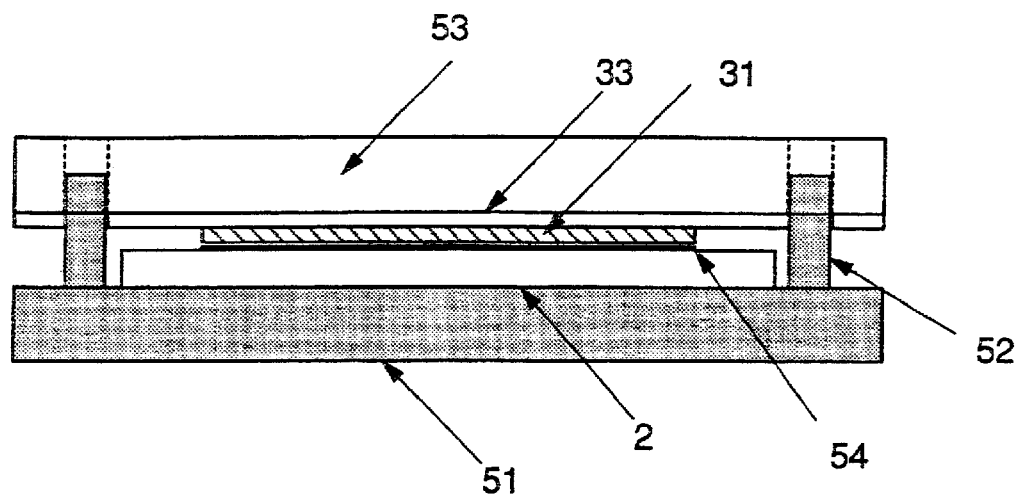
FIG. 4 is a cross section of a jig for properly positioning a silicone rubber layer-integrated process sheet on a base and then sticking the silicone rubber layer to the base.

At the step (D), the silicone rubber layer 31 stamped into a prescribed shape on the process sheet at the step (B) is positioned properly and put up on the base 2 (FIG. 4). More specifically, the base 2 prepared at the step (B) is inserted between a die 51 having registration pins 52 and a die 53, and hold in a prescribed place. Then, the silicone rubber layer 31 stamped into a prescribed shape on the process sheet is put on the base 2. At this time, the registration pins 52 are passed through the guide holes 32 bored in the process sheet 33, and thereby the base 2 and the silicone rubber layer 31 are positioned accurately. Further, the flatness precision of the silicone rubber layer is adjusted properly by applying pressure to the dies 51 and 53 in the vertical direction.

Figure 5:
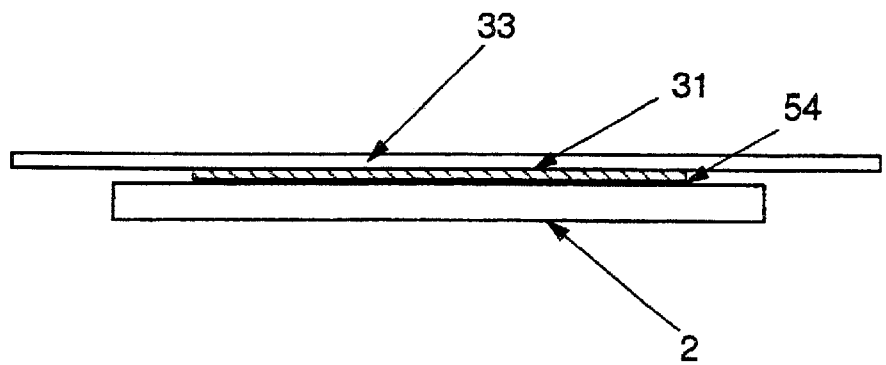
FIG. 5 is a cross section of a dustproof covering film-attached wafer support according to the invention.
Figure 6:
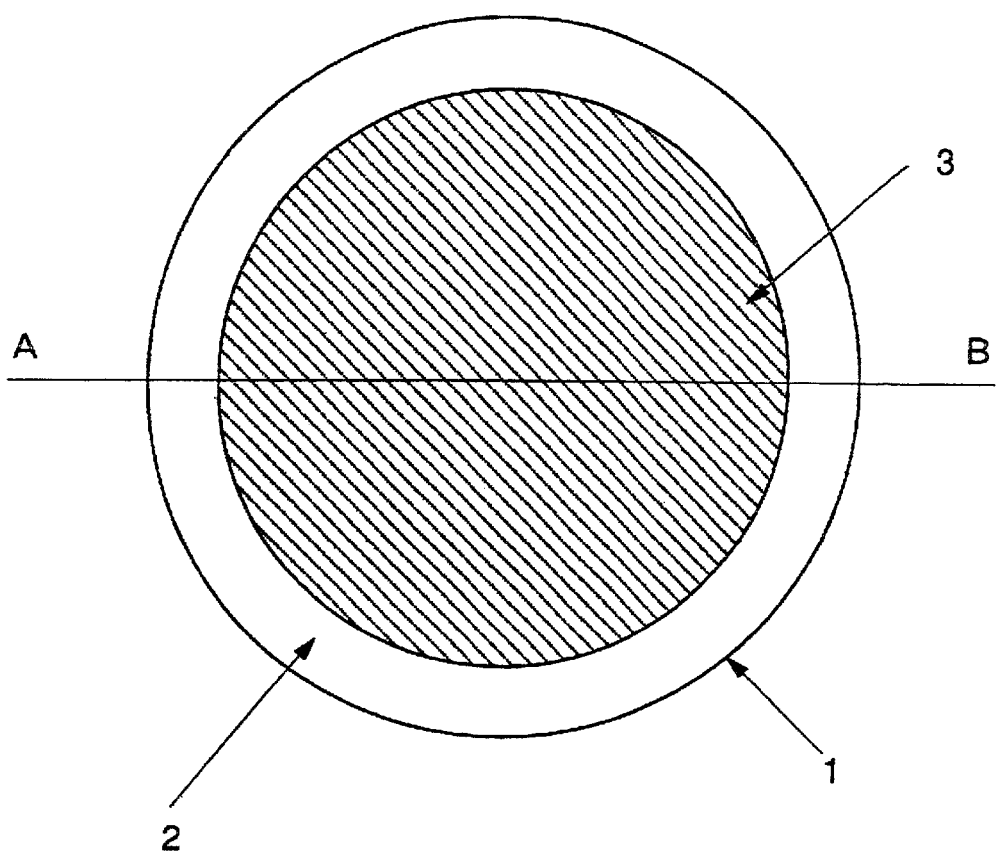
FIG. 6 shows plan and cross sectional views of a dustproof covering film-attached wafer support wherein the process sheet dustproof covering film) and the base are cut in similar shapes.
Figure 6:
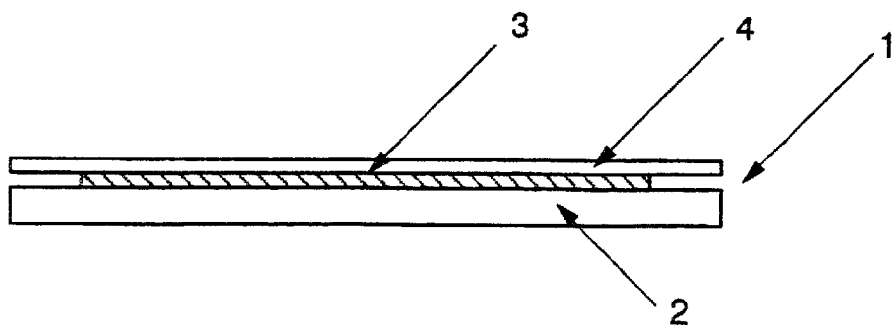

Furthermore, the process sheet (dustproof covering film) 33 may be cut off into a piece of a desired shape during or after the step (D). The dustproof covering film-attached wafer support obtained at the step (D) is shown in FIG. 5, while in FIG. 6 is shown the dustproof covering film-attached wafer support 1 wherein the process sheet (dustproof covering film) and the base 2 are cut in similar shapes.

By the use of wafer supports according to embodiments of the invention, the generation of particles in the process of semiconductor production can be reduced greatly since the present wafer supports make it possible to prevent the generation of particles during the transport and installation operations and the pollution of wafers therewith. As a result, semiconductor wafers significantly reduced in quantity of particle adhesion can be used for the production of semiconductor device units. Moreover, the present method enables the production of such wafer supports in a clean condition at a low price.

In addition, since the dustproof covering film is peeled apart after the dustproof covering film-attached wafer support is installed in a chamber of semiconductor production apparatus, the installation can be carried out as the covering film is held with both hands, and thereby installation workability, speed and reliability can be enhanced.

Now, the invention is illustrated in more detail by reference to the following examples, but these examples should not be construed as limiting the scope of the invention in any way.

Additionally, the entire disclosure of all applications, patents and publications, cited above and below, and of corresponding Japanese application No. 11-276216, filed in Sep. 29, 1999, is hereby incorporated by reference.

EXAMPLE 1

A 100 $\mu$m-thick polyethylene terephthalate (PET) film having a width of 400 mm was subjected to shot blast processing to get a surface roughness Ra of 0.8 $\mu$m. In a clean room controlled so as to have a cleanness of class 100, a silicone rubber compound having the following composition was formed into a 200 $\mu$m-thick layer on the blast-processed surface of PET film by calender processing with a calender roll. Then, the silicone rubber layer thus formed was cured in an oven by heating at 150° C. for 30 minutes, followed by after-curing at 200° C. for 4 hours. Thus, a PET-silicone rubber complex sheet as shown in FIG. 1 was prepared.

Composition of Silicone Rubber Compound:

a: 100 parts by weight of methylvinylpolysiloxanes constituted of 99.85 mole % of dimethylsiloxane units and 0.15 mole % of methylvinylsiloxane units (average polymerization degree: 8,000)

b: 2 parts by weight of paramethylbenzoyl peroxide c: 15 parts by weight of silica (Crystalite, produced by Tatumori Co., Ltd.)

d: 30 parts by weight of fumed silica having the surface treated with hexamethyldisilazane (specific surface area: 30 g/m$^2$)

e: 0.3 parts by weight of zinc stearate

The PET-silicone rubber complex sheet obtained was stamped with a stamping die as shown in FIG. 2 (so that the silicone rubber layer had a circular shape 200 mm in diameter), and then the unnecessary part of the silicone rubber layer was peeled away to prepare the PET-silicone rubber complex sheet as shown in FIG. 3. The peel strength of the PET-silicone rubber complex sheet was found to be 50 g/25 mm.

Next an adhesive, KE1825 (a heat-curable silicone adhesive, produced by Shin-Etsu Chemical Co., Ltd.), was applied to an aluminum base having a diameter of 300 mm and a height of 10 mm by the use of a screen printing process so that it located correctly in place and had a thickness of 5 $\mu$m. Then, the resulting base and the PET-silicone rubber complex sheet were laminated with a jig shown in FIG. 4, and subjected to adhesion forming under a condition that the heating at 130° C. was carried out for 30 minutes under a pressure of 3 MPa. Thus, a wafer support having a silicone rubber layer covered with a dustproof PET covering film as shown in FIG. 5 was obtained.

The thus obtained wafer support was encased in a polyethylene bag cleaned with purified water, followed by deaeration and heat seal. Then, the wafer support encased in the bag was conveyed, brought in a semiconductor device production site, and installed in an ion injection apparatus, followed by peeling-apart of the dustproof PET covering film. A semiconductor wafer was carried onto the wafer support by means of a robot mechanism, and underwent ion injection.

Thereafter, the number of particles adhering to the back of the wafer was measured with a particle counter (Surf Scan 6200, made by Hitachi Ltd.). As a result, it was found that the particles measuring 0.2 to 2 $\mu$m in size was very few in number and the detected number thereof was 123.

EXAMPLE 2

A 50 $\mu$m-thick polyimide (PI) film (having the same size as PET used in Example 1) was subjected to shot blast processing to get a surface roughness Ra of 0.4 $\mu$m. In a clean room controlled so as to have a cleanness of class 100, the blast-processed surface of PI film was coated with a fluorine-containing release agent, F-Coat 100 (produced by Shin-Etsu Chemical Co., Ltd.), and then with a binary liquid type addition reaction-curable silicone rubber, KE1963A/B (produced by Shin-Etsu Chemical Co., Ltd.), by means of a comma coater. Then, the silicone rubber layer thus formed was cured in an oven by heating at 150° C. for 30 minutes.

Thus, a PI-silicone rubber complex sheet as shown in FIG. 1 was prepared. This PI-silicone rubber complex sheet was found to have a peel strength 100 g/25 mm.

The same operations as in Example 1 were carried out except that the foregoing PI-silicone rubber film was used in place of the PET-silicone rubber complex sheet. As a result, it was found that very few particles which had their sizes in the range of 0.2 to 2 μm adhered to the back of the wafer and the number of such particles detected was 103.

COMPARATIVE EXAMPLE 1

In a clean room controlled so as to have a cleanness of class 100, a silicone rubber compound having the same composition as used in Example 1 was formed into a 200 μm-thick layer on the surface of 100 μm-thick PET film having a surface roughness of 0.05 μm (but being the same in size as PET used in Example 1) by extrusion coating with an extruder. Then, the silicone rubber layer thus formed was cured in an oven by heating at 150° C. for 30 minutes, followed by after-curing at 200° C. for 4 hours. Thus, a PET-silicone rubber complex sheet was prepared. The peel strength of the thus prepared PET-silicone rubber complex sheet was 1 g/25 mm.

The same operations as in Example 1 were carried out using this PET-silicone rubber film. As a result, it was found that a great many particles having their sizes in the range of 0.2 to 2 μm adhered to the back of the wafer and the number of the particles detected was 9,800.

What is claimed is:

1. A wafer support comprising a base, a silicone rubber layer substantially uniform in thickness and integrated with the base, and a dustproof covering film, the base, silicone rubber layer and dustproof covering film forming a wafer support, said dustproof covering film being attached to the silicone rubber layer in a state that the dustproof covering film is capable of being peeled apart from the silicone rubber layer and the peel strength between the dustproof covering film and the silicone rubber layer is from 5 to 500 g/25 mm, measured by the T-type peeling test according to JIS K 6854.

2. A method for preparing a dustproof covering film-attached wafer support, wherein the wafer support is according to claim 1, comprising the following steps (A) to (D):
   (A) a step of forming a silicone rubber layer having a substantially uniform thickness on a process sheet having a surface roughness of 0.1 to 5.0 μm in terms of Ra defined in JIS B 0601,
   (B) a step of forming the silicone rubber layer into a desired shape and boring guide holes for registration in the process sheet,
   (C) a step of applying an adhesive to one surface of a base, and
   (D) a step of sticking the silicone rubber layer formed on the process sheet to the adhesive-applied base surface, wherein the guide holes bored in the process sheet are used for properly positioning the silicone rubber layer on the base.

3. A method of using a dustproof covering film-attached wafer support, wherein the wafer support is according to claim 1, comprising a step of peeling the dustproof covering film apart from the silicone rubber layer in the processing room of a device production apparatus selected from a group consisting of an exposure apparatus, an ion injector, an etching apparatus, a CVD apparatus, a sputtering apparatus and a burn-in apparatus, and a step of fixing a semiconductor wafer onto the silicone rubber layer of the wafer support.

4. A wafer support comprising a base made of metal or ceramic, a silicone rubber layer substantially uniform in thickness and provided on the base via a primer layer or an adhesive layer in an integrated form, and a dustproof covering film, the base, silicone rubber layer and dustproof covering film forming a wafer support, wherein the dustproof covering layer is attached to the silicone rubber layer in a peelable state that the dustproof covering film has a peel strength of 5 to 500 g/25 mm, as measured by the T-type peeling test according to JIS K 6854, when peeled from the silicone rubber layer.

5. A wafer support comprising a base, a substantially uniform thickness silicone rubber layer integrated with the base and a dustproof covering film attached to the silicone rubber layer, which can be peeled away from the silicone rubber layer, the base, silicone rubber layer and dustproof covering film forming a wafer support.

6. A wafer support according to claim 1, wherein the base is made of metal or ceramic or a combination thereof.

7. A wafer according to claim 1, wherein the covering film has a peel strength of 10 to 100 g/25 mm.

8. A wafer according to claim 1, wherein the covering film has a surface roughness of 0.1 to 5.0 μm.

9. A wafer according to claim 1, wherein the covering film has a surface roughness of 0.3 to 2.0 μm.

10. A wafer according to claim 1, wherein the covering film comprises polyethylene terephthalate, nylon, polyimide or polytetrafluoroethylene.

11. A wafer according to claim 1, wherein the covering film has a thickness of 25 to 1,000 μm.

12. A wafer according to claim 1, wherein the covering film has a thickness of 50 to 300 μm.

13. A wafer according to claim 1, wherein the thickness of the silicone rubber layer varies to a maximum of about ±0.05 mm or below.

14. A wafer according to claim 1, wherein the thickness of the silicone rubber layer is 10 to 2,000 μm.

15. A wafer according to claim 1, wherein the thickness of the silicone rubber layer is 50 to 500 μm.

16. A wafer according to claim 1, further comprising an adhesive between the base and the silicone rubber.

17. A method for preparing a dustproof covering film-attached wafer support, wherein the wafer support is according to claim 4, comprising the following steps (A) to (D):
   (A) a step of forming a silicone rubber layer having a substantially uniform thickness on a process sheet having a surface roughness of 0.1 to 5.0 μm in terms of Ra defined in JIS B 0601,
   (B) a step of forming the silicone rubber layer into a desired shape and boring guide holes for registration in the process sheet,
   (C) a step of applying an adhesive to one surface of a base, and
   (D) a step of sticking the silicone rubber layer formed on the process sheet to the adhesive-applied base surface, wherein the guide holes bored in the process sheet are used for properly positioning the silicone rubber layer on the base.

18. A method of using a dustproof covering film-attached wafer support, wherein the wafer support is according to claim 4, comprising a step of peeling the dustproof covering film apart from the silicone rubber layer in the processing room of a device production apparatus selected from a group consisting of an exposure apparatus, an ion injector, an etching apparatus, a CVD apparatus, a sputtering apparatus and a burn-in apparatus, and a step of fixing a semiconductor wafer onto the silicone rubber layer of the wafer support.

19. A method for preparing a dustproof covering film-attached wafer support, wherein the wafer support is according to claim 5, comprising the following steps (A) to (D):
   (A) a step of forming a silicone rubber layer having a substantially uniform thickness on a process sheet having a surface roughness of 0.1 to 5.0 μm in terms of Ra defined in JIS B 0601, (B) a step of forming the silicone rubber layer into a desired shape and boring guide holes for registration in the process sheet, (C) a step of applying an adhesive to one surface of a base, and (D) a step of sticking the silicone rubber layer formed on the process sheet to the adhesive-applied base surface, wherein the guide holes bored in the process sheet are used for properly positioning the silicone rubber layer on the base.

20. A method of using a dustproof covering film-attached wafer support, wherein the wafer support is according to claim 5, comprising a step of peeling the dustproof covering film apart from the silicone rubber layer in the processing room of a device production apparatus selected from a group consisting of an exposure apparatus, an ion injector, an etching apparatus, a CVD apparatus, a sputtering apparatus and a burn-in apparatus, and a step of fixing a semiconductor wafer onto the silicone rubber layer of the wafer support.

* * * * *